(12) United States Patent
Kim et al.

(10) Patent No.: US 7,640,960 B2
(45) Date of Patent: Jan. 5, 2010

(54) APPARATUS FOR ATTACHING SUBSTRATES

(75) Inventors: Dong Gun Kim, Seongnam-si (KR); Jae Seok Hwang, Seongnam-si (KR)

(73) Assignee: ADP Engineering Co., Ltd., Gyeongki-Do (KR)

( * ) Notice: Subject to any disclaimer, the term of this patent is extended or adjusted under 35 U.S.C. 154(b) by 0 days.

(21) Appl. No.: 11/866,843

(22) Filed: Oct. 3, 2007

(65) Prior Publication Data

US 2008/0124198 A1 May 29, 2008

(30) Foreign Application Priority Data

Nov. 29, 2006 (KR) ............... 10-2006-0118840

(51) Int. Cl.
*B29C 65/00* (2006.01)
*B32B 37/00* (2006.01)
*B31F 5/00* (2006.01)
*B65H 29/00* (2006.01)
*G02F 1/13* (2006.01)

(52) U.S. Cl. ............ 156/382; 156/286; 156/556; 349/187

(58) Field of Classification Search ............ 156/381, 156/382, 538, 539, 556, 580, 285, 286, 581, 156/583.1; 349/187, 189, 190, 191; 445/66
See application file for complete search history.

(56) References Cited

U.S. PATENT DOCUMENTS

| 2002/0088555 | A1* | 7/2002 | Urano ............ 156/581 |
| 2003/0168176 | A1* | 9/2003 | Byun et al. ........ 156/382 |
| 2004/0095548 | A1* | 5/2004 | Lim et al. ......... 349/187 |
| 2007/0052914 | A1* | 3/2007 | Ito et al. .......... 349/190 |

FOREIGN PATENT DOCUMENTS

JP 2004233473 A * 8/2004

* cited by examiner

*Primary Examiner*—Jeff H Aftergut
*Assistant Examiner*—Brian R Slawski
(74) *Attorney, Agent, or Firm*—KED & Associates, LLP

(57) ABSTRACT

An apparatus for attaching two substrates to one another includes a lower chamber that holds a first substrate and an upper chamber that holds a second substrate. The upper and lower chambers are brought together to provide a space in which an attaching process is performed. Chamber transportation mechanisms are located at corners of the lower chamber and serve to move the lower chamber up toward the upper chamber so that it can be coupled with the upper chamber. Guide parts are also formed on side surfaces of the lower chamber to guide movement, and to reduce deformation of the chamber when pressure differentials act to deform the sides of the chamber.

20 Claims, 7 Drawing Sheets

APPARATUS FOR ATTACHING SUBSTRATES

This application claims the benefit under 35 U.S.C. § 119 of the filing date of Korean Patent Application No. 10-2006-0118840, filed on Nov. 29, 2006, the entire contents of which are incorporated herein by reference.

BACKGROUND

1. Field

The present disclosure relates to an apparatus for attaching substrates to one another, and more particularly to an apparatus for attaching substrates together in which a height adjustment of a chamber is facilitated.

2. Background

With the development of an information society, requirements for display devices have increased. In response, various flat panel display devices, such as a liquid crystal display, (LCD), plasma display panel, (PDP), etc. have been developed.

LCD display devices are now widely used in various devices such as televisions, mobile phones and computer displays due to their advantages of superior video quality, light weight, slim profile and low power consumption. A LCD display device typically includes a liquid crystal material injected between a thin film transistor (TFT) substrate formed with electrodes and a color filter (CF) substrate coated with a fluorescent substance. During the manufacture of an LCD display device, an apparatus used for injecting liquid crystals and aligning and attaching two substrates is referred as a substrate attaching apparatus.

In the substrate attaching apparatus, substrates are mounted on upper and lower stages placed in an upper chamber and a lower chamber, respectively. The upper chamber and the lower chamber are then brought together to form a sealed attaching space. Air is exhausted from the sealed attaching space to form a vacuum state, and the two substrates are aligned accurately and then attached to each other.

However, because an inside of the chamber is in a vacuum state and the outside of the chamber is under atmospheric pressure, the chamber may be physically deformed. Such deformation of the chamber may cause a deformation of a driving part used to move the upper and lower stages together. This can obstruct the up and down movements of the upper and/or lower stages of the chamber. Due to these deformations, undesirable stress is generated in the chamber, and a malfunction of the attaching apparatus may occur, thereby shortening a lifetime of the attaching apparatus.

FIG. 6 shows a location of a chamber transportation part in accordance with a conventional substrate attaching apparatus. When an inside of the chamber of the substrate attaching apparatus is evacuated so that it assumes a vacuum state, the atmospheric pressure is applied to an outside of the chamber. By such pressure, the chamber may be deformed, as illustrated by dotted line in FIG. 6. Note, this deformation has been magnified to better illustrate the deformation.

As shown in FIG. 6, the stress generated by the pressure differentials may causes deformation of the lower chamber 100 and the upper chamber (not shown), and deflection of the vertically standing chamber transportation parts 130. Due to this deflection, a relatively large force is required to lift or lower the lower chamber 100. Also, the chamber transportation parts 130 are not exactly vertical, but rather are inclined slightly. As a result, there is a difficulty in a height adjustment.

As shown in FIG. 6, the stress generated by the pressure differentials may causes deformation of the lower chamber 100 and the upper chamber 110, and deflection of the vertically standing chamber transportation parts 130. Due to this deflection, a relatively large force is required to lift or lower the lower chamber 100. Also, the chamber transportation parts 130 are not exactly vertical, but rather are inclined slightly. As a result, there is a difficulty in a height adjustment.

Further, due to the deflection of the chamber transportation parts 130, it is difficult for the chamber transportation part 130 to control easily the up/down movement of the lower chamber and the chamber transportation part 130 is subject to increased stress when moving the lower chamber upward and downward. Therefore, the lifetime of the chamber transportation parts 130 may be shortened.

BRIEF DESCRIPTION OF THE DRAWINGS

The embodiments will be described in detail with reference to the following drawings, in which like reference numerals refer to like elements, and wherein.

DETAILED DESCRIPTION

Figure 1:
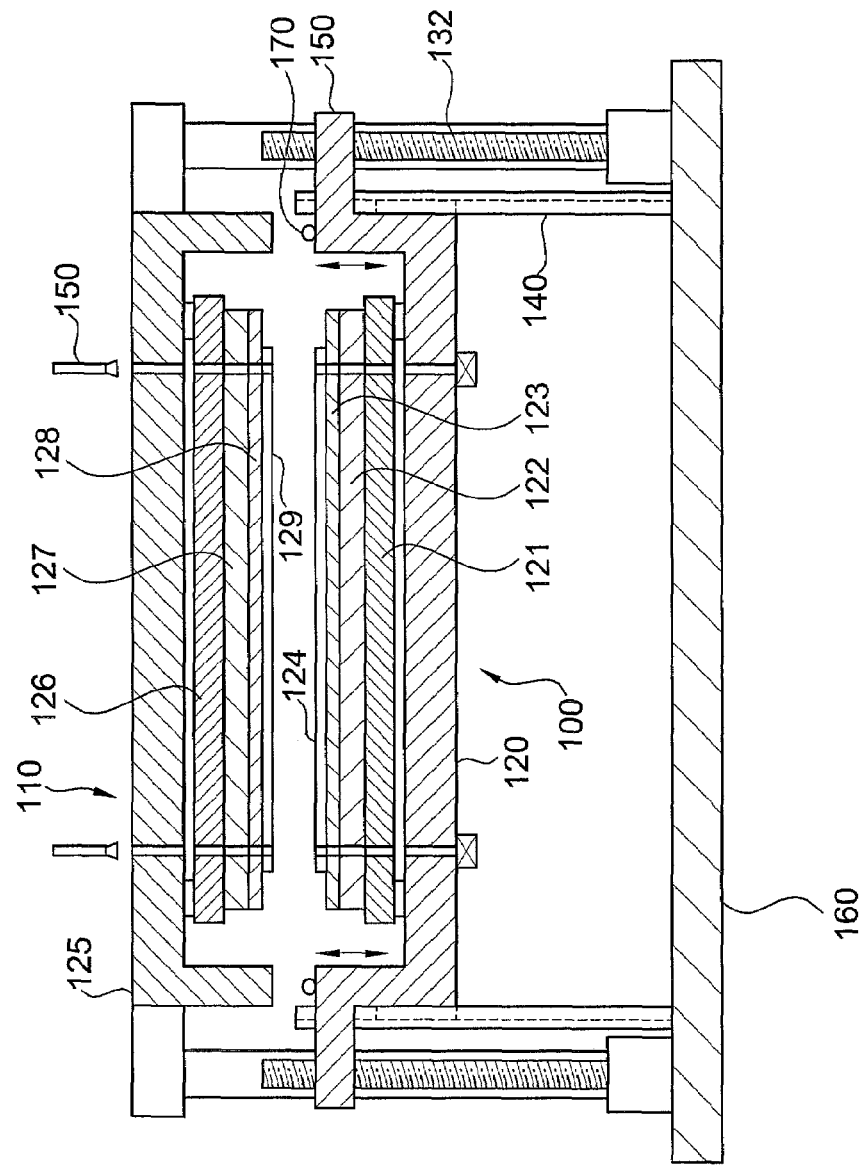
FIG. 1 is a schematic view illustrating a first embodiment for attaching substrates.

As shown in FIGS. 1-4, an attaching apparatus may include a lower chamber 100, an upper chamber 110, a chamber transportation part 130, a guide part 140, an alignment means, a base 160 and a sealing member 170. The base 160 is provided at a bottom of the lower chamber 100, and serves to support the lower chamber 100 and the upper chamber 110. The base 160 may include height adjustment parts (not shown) at each corner, or at a plurality of predetermined positions, in order to adjust a flatness of a leveling of a bottom of the apparatus.

The lower chamber 100 is located at a lower part of the attaching apparatus and serves to raise and lower a first substrate 124, which is attached to the lower chamber 100. For example, a TFT substrate or a CF substrate may be used as the first substrate when the attaching apparatus is used for manufacturing a liquid crystal display.

This lower chamber 100 may include a lower vessel 120 for providing a space of the lower chamber, and a flat lower surface plate 121 located in an inside of the lower vessel. A lower stage 122 is mounted on the lower surface plate 121 and is capable of moving in X, Y and possibly rotational directions in the horizontal plane. A lower substrate chuck 123 is provided on the lower stage 122 and is used to hold and release the first substrate 124. The lower surface plate 121, the lower stage 122 and the lower substrate chuck 123 may be formed integrally to construct a single lower stage.

The lower vessel 120 forms a space of the lower chamber 100. The lower vessel 120 can move up and down under the action of the transportation part 130.

The lower surface plate 121 is provided on a bottom surface of the lower vessel 120. The lower surface plate 121 serves to support the lower stage 122 and the lower substrate chuck 123. The lower stage 122 is fixed to the lower vessel and is moved up and down with the lower vessel, but the lower stage can also move on a horizontal plane to perform a substrate alignment. Therefore, the lower stage 122 can move and rotate in the horizontal plane, and may include an alignment means for inducing such movement and rotation.

Since a defect may be generated if the first substrate 124 and the second substrate 129 are not properly aligned during the attachment process, the first substrate 124 and the second substrate 129 are brought into alignment with each other by the movement and rotation of the first substrate 124 located at the lower part. Of course, in alternate embodiments, the upper substrate on the upper chamber may be movable to accomplish the proper alignment. In still other embodiments, one of the first and second chambers may be capable of being raised or lowered, while the other can move in x and y directions to accomplish the proper alignment.

In the illustrated embodiment, the lower substrate chuck 123, which holds the first substrate 124, may include various holding means, such as an electrostatic chuck, a vacuum chuck, etc. In the case of an electrostatic chuck, the substrate can be held by an attracting force generated by an electric charge which is induced when a voltage is applied to the substrate by an electrode inserted in the chuck. In the case of a vacuum chuck, the chuck is provided with a plurality of holes and the substrate can be held by a vacuum that is applied to the holes in the chuck. In some embodiments, the first substrate 124 may be fixed to the lower stage with both an electrostatic force and a vacuum force.

The upper chamber 110 is located at an upper part of the attaching apparatus. The upper chamber helps to provide a space, in which the attaching process is performed. The second substrate 129 is attached to the upper chamber 110 located at the upper part.

The upper chamber 110 may include an upper vessel 125 for providing a space of the chamber, an upper surface plate 126 located in the upper vessel, an upper stage 127 mounted on the upper surface plate, and an upper substrate chuck 128 provided on the upper stage and on which the second substrate 129 is held. The upper surface plate 126, the upper stage 127 and the upper substrate chuck 128 may be formed integrally to construct a single upper stage.

The upper vessel 125 provides a space of the upper chamber. The upper vessel 125 forms a vertically symmetric structure with the lower vessel 120 and is coupled with the lower vessel 120 to provide the sealed attaching space in which the attachment process is performed.

In the upper space of the upper vessel 125, the upper surface plate 126, the upper stage 127 and the upper substrate chuck 128 are installed in sequence. The upper stage 127 is installed on the upper surface plate 126 and provides a surface on which the second substrate 129 located at the upper part is seated.

The upper substrate chuck 128 serves to hold the upper substrate 129 while the attaching process is performed. Therefore, the upper substrate chuck 128 includes a holding means, which may be an electrostatic chuck or a vacuum chuck. In order to fix the upper substrate chuck, the upper stage and the upper surface plate on the upper vessel, the upper substrate chuck, the upper stage and the upper surface plate are provided with holes at their peripheries and a screw or a pin is inserted into the holes to connect them to the upper vessel.

The alignment means may include a location detecting part 150 for detecting locations of the substrates relative to one another, and an alignment part (not shown) for moving one or both of the substrates to bring them into proper alignment. The location detecting part 150 detects alignment marks formed at predetermined portions of the substrates. One or both of the substrates is moved so that the alignment marks come into registration, and then first substrate 124 and the second substrate 129 are properly aligned.

The location detecting part 150 can include one or more image obtaining means such as cameras, CCDs, etc., which can detect the alignment marks on the substrates. The location detecting part 150 is configured to simultaneously detect multiple the alignment marks on the first and second substrates, and the image devices are installed at least two positions.

The alignment part which physically moves the two substrates based on information from the location detecting part 150, can move and rotate at least one of the substrates by moving and rotating the lower or upper stage on a horizontal plane. Therefore, known driving means such as a motor, etc. may be used to move the stage. A rough alignment is performed when a distance between the first and second substrates is relatively large and a fine alignment is performed when the distance becomes closer since the location detecting part can more accurately determine the state of alignment as the distance between the upper and lower substrates becomes smaller.

The sealing member 170 serves to seal the attaching space formed between the lower chamber 100 and the upper chamber 110. The elastic sealing member 170 is installed at a portion of the lower chamber 100 or the upper chamber 110, where the lower chamber 100 and the upper chamber 110 come into contact with each other, thereby preventing a direct contact of the lower chamber and the upper chamber and helping the generation of the sealed space by the coupling of the lower chamber and the upper chamber. The sealing member could be an O-ring, a rubber or silicon packing, a gasket, etc.

When the sealed space is formed due to the upper movement of the lower chamber 100, air within the sealed space is exhausted by a vacuum pump. Once a predetermined vacuum state is formed, the second substrate located at the upper part is released by the upper chuck 128 so that it drops down onto the lower substrate 124. A sealant on one or both of the substrates initially attaches the substrates to one another. Gas may then be injected into the sealed space to apply a pressure to the exterior of the stacked substrates so as to push the first and second substrates together. Consequently, the first substrate and the second substrate are sealingly attached.

Figure 2:
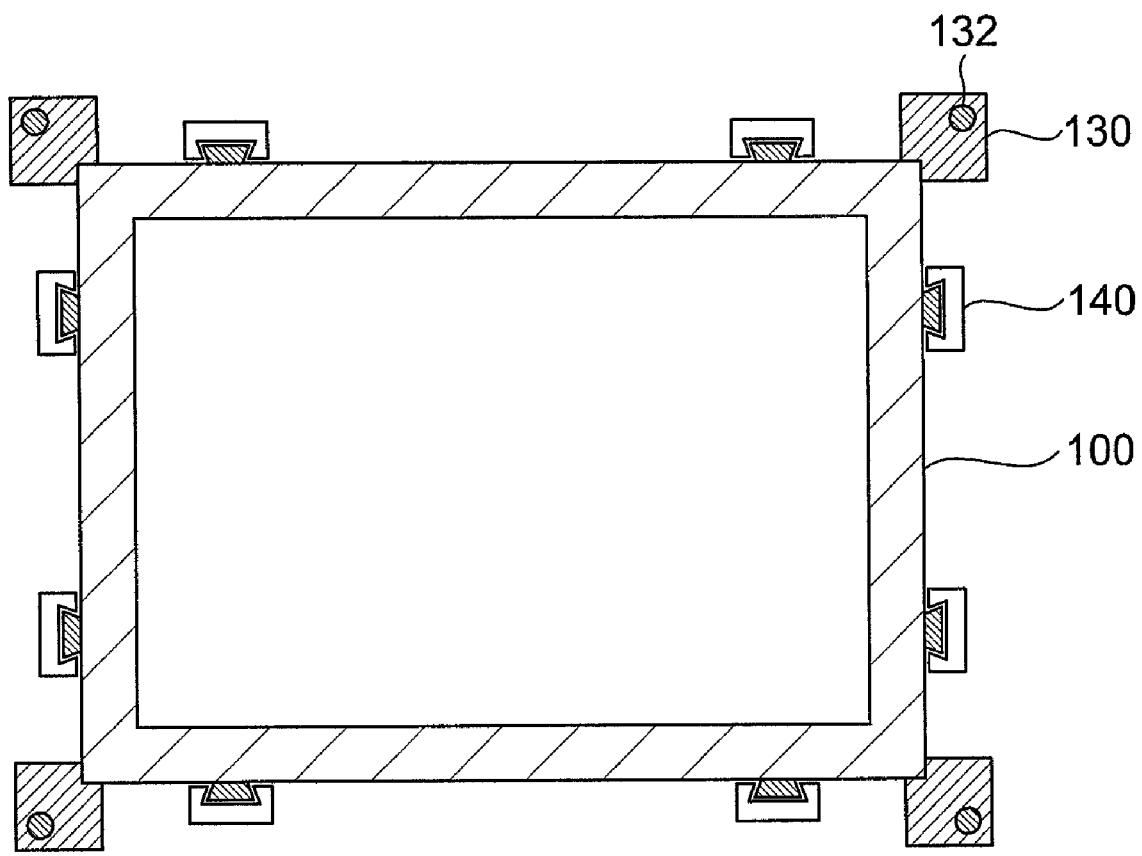
FIGS. 2 and 3 show locations of a chamber transportation part and a guide part of the attaching apparatus shown in FIG. 1.
Figure 3:
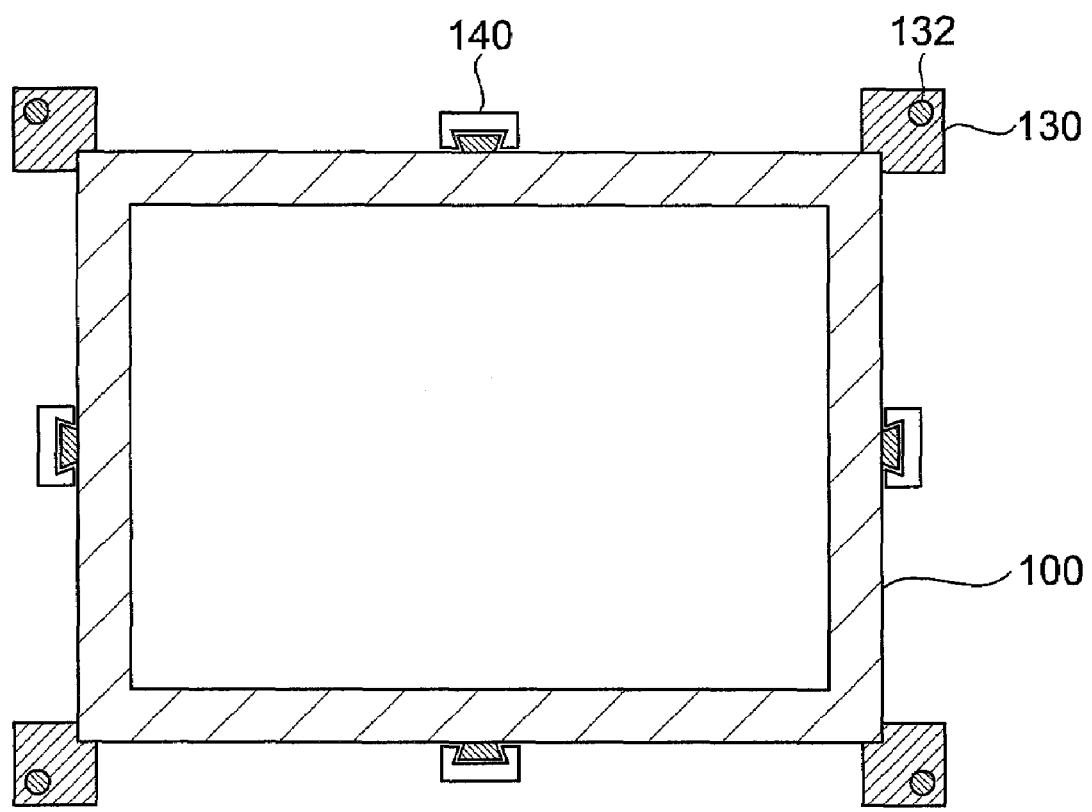
Figure 4:
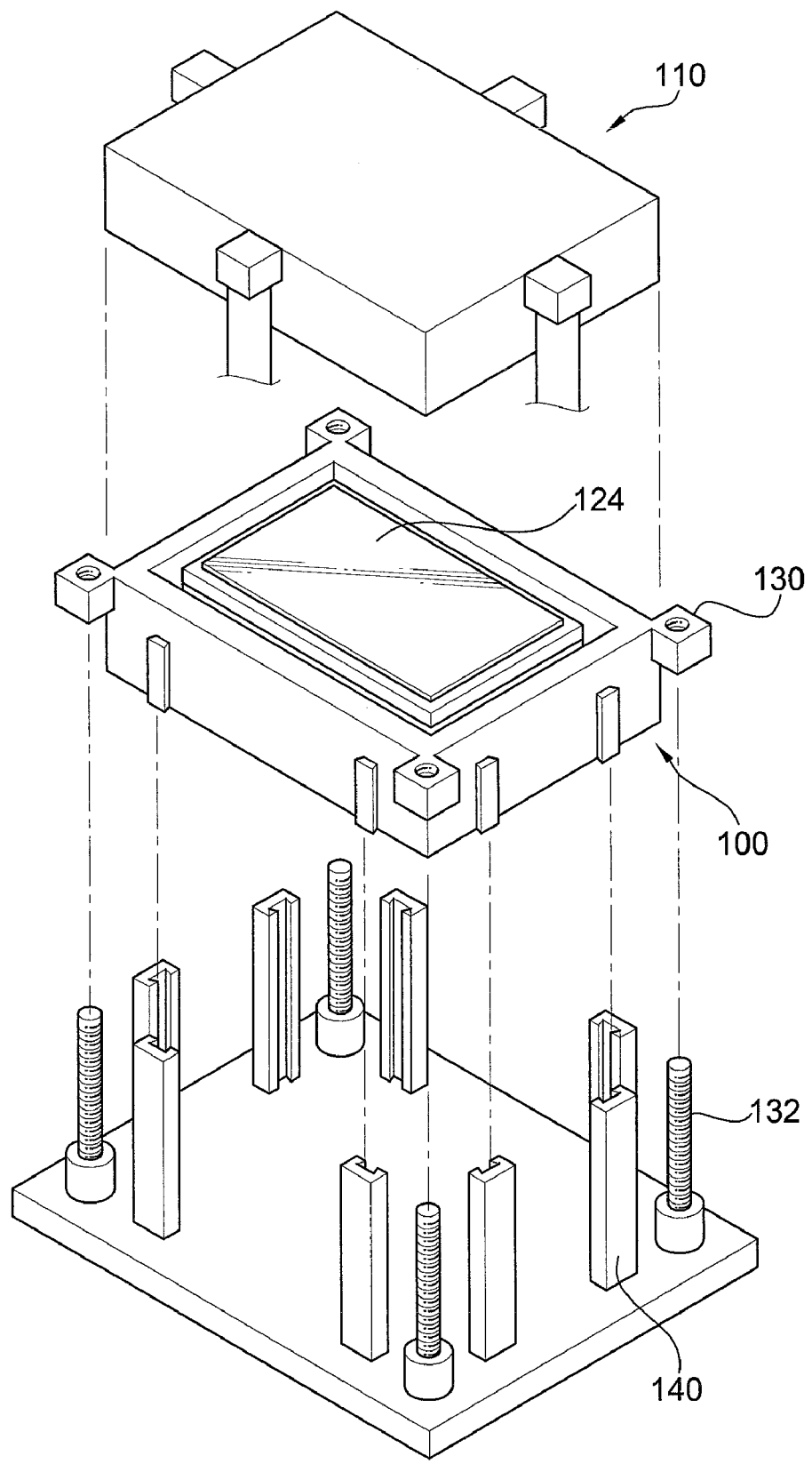
FIG. 4 is an exploded view illustrating the attaching apparatus with the chamber transportation part and the guide part.

FIGS. 2 and 3 show locations of the chamber transportation parts and the guide parts in accordance with two different embodiments. FIG. 4 is an exploded view illustrating the attaching apparatus having the transportation parts and the guide parts arranged as shown in FIG. 2.

The chamber transportation parts 130 extend vertically upward from the base 160 and are attached to the lower chamber 100. An operation of the chamber transportation parts 130 causes a lifting and lowering of the lower chamber 100. The lower chamber 100 is coupled with the upper chamber 110 by its lifting and is separated from the upper chamber by its lowering.

The chamber transportation parts 130 may include a driving part (not shown) for generating a driving force by a motor or an engine and an up/down transportation part for moving up and down the lower chamber by the generated driving force. The up/down transportation part may be a ball screw 132 which changes the rotation of a vertical shaft into a linear movement. Alternatively, a chain, a piston, etc. may be used as the up/down transportation part. Additional devices such as linear motors could also be used as the transportation parts.

The chamber transportation parts 130 may be located at each corner of the lower chamber 100 and they serve to raise and lower the lower chamber. When the substrate is square or rectangular, and thus the cross-sections of the chambers 100 and 110 are square or rectangular, the chamber transportation parts are located at corners of the apparatus. The deflection of the corners is less than the deflections that occur at the centers of the sides of the apparatus. Thus, although the same deformation due to pressure differences is occurring, a twist or a deflection of the chamber transportation parts 130 is reduced.

The guide parts 140 also extends vertically up from the base 160 and are coupled with the lower chamber 100. The guide parts may be linear movement (LM) guides including a groove for guidance, to which a lubricating liquid is applied, and a bearing for reducing a frictional force. The guide parts 140 serve to guide the up/down movement of the lower chamber 100 and to support the lower chamber 100. The guide parts 140 may be located at two locations on each side of the chamber transportation part, as shown in FIG. 2. In alternate embodiments, the guide parts may only be located at a center portion of each side surface of the lower chamber, as shown in FIG. 3. The guide parts 140 are coupled with the lower chamber 100, but are not integral with the lower chamber. The guide parts support the lower chamber 100 so that the up/down movement of lower chamber passes through a fixed path.

The guide parts 140 serves not only to guide the up/down movement of the lower chamber 100, but also to partially prevent a deformation of the lower chamber 100 due to a pressure difference, by adding rigidity to the structure. Therefore, the guide parts 140 may be made of a material such as iron, SUS, etc. having a high modulus of elasticity E and resultant superior rigidity.

Figure 5:
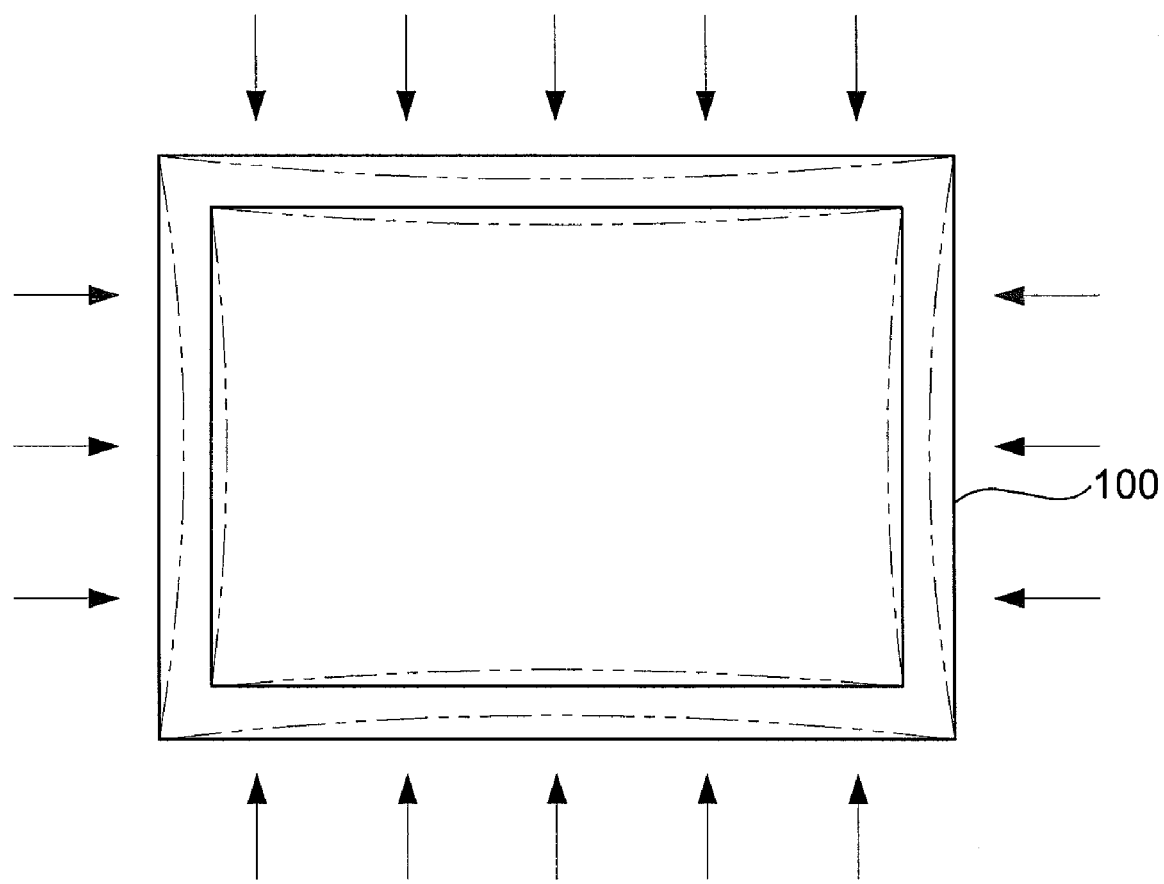
FIG. 5 is a cross-sectional view showing how atmospheric pressure is applied to a chamber of the attaching apparatus, and the resultant deformation of the chamber.
Figure 6:
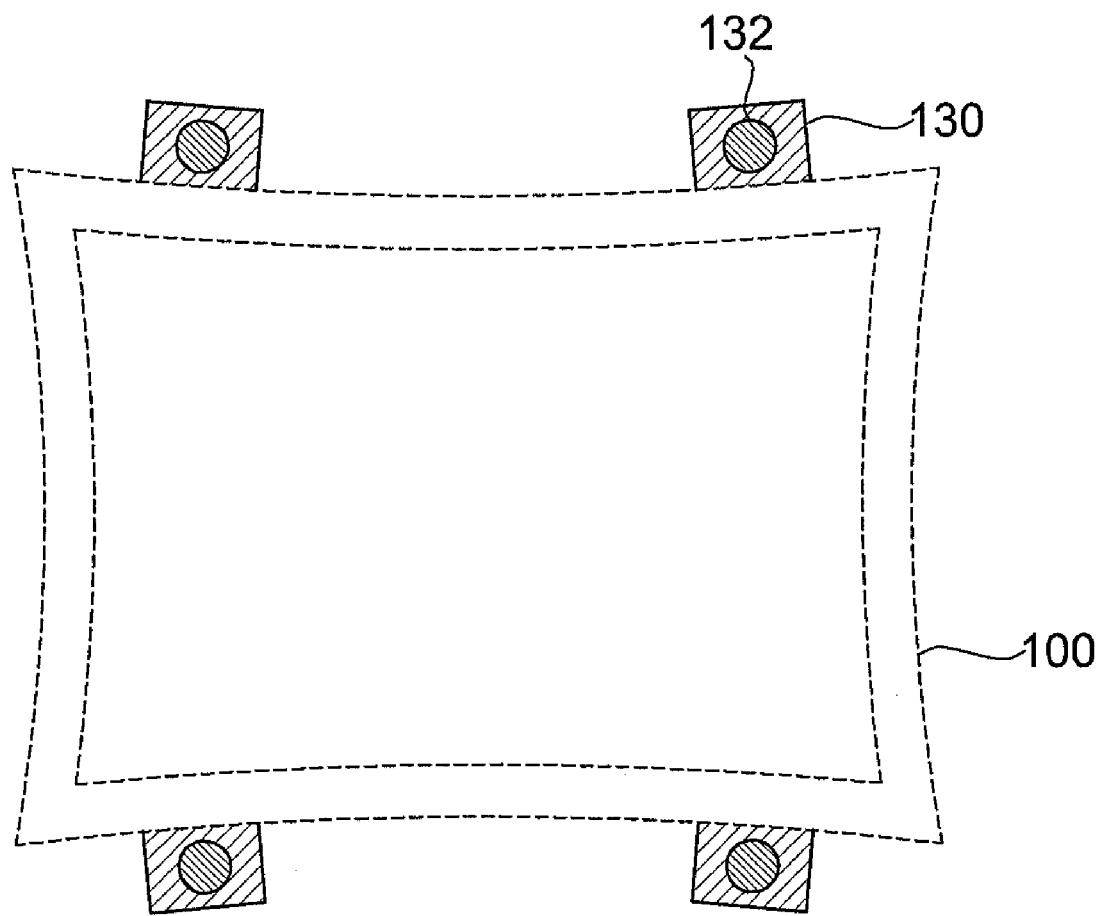
FIG. 6 shows locations of chamber transportation parts in accordance with a conventional substrate attaching apparatus.
Figure 7:
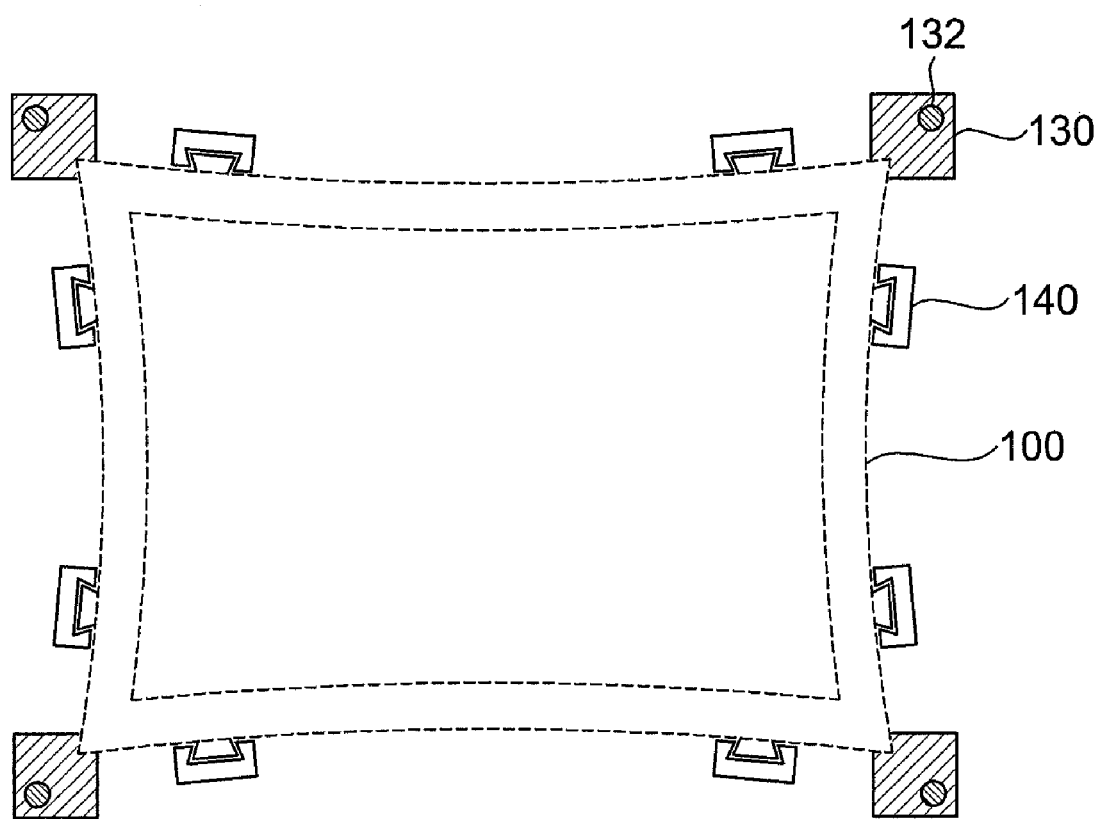
FIG. 7 shows the locations of a chamber transportation part and a guide part of the attaching apparatus shown in FIGS. 2 and 4.

FIG. 5 is a cross-sectional view with arrows to illustrate a pressure that is applied to a chamber of the attaching apparatus, and the resultant deformation of the chamber. The dashed lines show how the chamber will deform when a force is applied to sides of the chamber.

In order to solve the problems caused by deformation of the sides of the chamber, the locations of the chamber transportation parts 130 are moved to the corners of the chamber, and the guide parts 140 may be added in order to reduce the deformation of the chamber. In the embodiments shown in FIGS. 2-4 and 7, the chamber transportation parts 130 are located at the corners of the lower chamber 100.

As described above, the lower chamber and the upper chamber will be in a stressed state due to the vacuum state within the attaching space. Therefore, some deformation is generated with respect to the corners of the chamber, which are vertically formed. A small deflection in a diagonal direction may be generated at the chamber transportation parts 130, which are located at the corners as the deformations of respective directions are added in together. However, since the chamber transportation parts are located at the corners of the chamber, a contracted length with respect to a side of the chamber is decreased, thereby reducing the total deflection of the chamber transportation parts. As a result, a force required for the chamber transportation parts 130 to lift or lower the lower chamber 100 is decreased relative to the conventional art attaching apparatus, and the chamber transportation parts 130 are relatively less deformed. This also means that a height adjustment in a lifting or lowering in a vertical direction can be more accurately performed.

In addition, by adding the guide parts 140 on the side surfaces of the chamber, the stress can be dispersed to the guide parts 140. The guide parts 140 can serve as a buffer to prevent the stress from being concentrated in the chamber transportation parts 130. The guide parts 140 also reduce deformation of the side surfaces of the chamber, to facilitate the up/down movement of the lower chamber 100. In some embodiments, as shown in FIG. 3, one guide part 140 is installed on each side surface of the chamber. In this embodiment, the guide parts 140 provide a path for up/down movement of the lower chamber and, at the same time, serve as a support for reducing the deformation of the lower chamber. The guide parts 140 may be located at the middle of the each side surface of the chamber shown in FIG. 3. Since the deformation of the chamber may be the largest at the middle of the side surface of the chamber, the guide parts 140 are provided at this position to serve as a support for reducing the deformation.

As described above, it is possible to reduce an error in the up/down movement of the chamber by locating the chamber transportation parts at corners of the chamber, thus reducing a vertical deflection of the chamber transportation parts. This makes the up/down movements easier to perform, and aids accuracy.

In addition, by adding guide parts at side surfaces of the chamber, it is possible to reduce the deformation of the chamber and to move the chamber more easily.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although a number of illustrative embodiments have been described, it should be understood that numerous other modifications and embodiments can be devised by those skilled in the art that will fall within the spirit and scope of the principles of this disclosure. More particularly, various variations and modifications are possible in the component parts and/or arrangements which would fall within the scope of the disclosure, the drawings and the appended claims. In addition to variations and modifications in the component parts and/or arrangements, alternative uses will also be apparent to those skilled in the art.

What is claimed is:

1. An apparatus for attaching substrates, comprising:
a lower chamber in which a first substrate is held;
an upper chamber in which a second substrate is held, wherein the upper and lower chambers can be brought together to form a sealed space in which the first and second substrates are attached to one another;
a chamber transportation mechanism that moves at least one of the lower and upper chambers so that the chambers can be brought together and moved apart, wherein the chamber transportation mechanism includes moving elements extending outward from outer surfaces of sidewalls of at least one of the lower and upper chambers at corners thereof.

2. The apparatus of claim 1, wherein the transportation mechanism moves the lower chamber up and down relative to the upper chamber.

3. The apparatus of claim 1, wherein the moving elements comprise four linear movement devices, and wherein one linear movement device extends outward from each of four corners of the at least one of the lower and upper chambers.

4. The apparatus of claim 1, wherein the chamber transportation mechanism comprises a motor that provides a driving force, and wherein the driving force of the motor is supplied to the moving elements.

5. The apparatus of claim 4, wherein the moving elements comprise ball and screw mechanisms that are coupled to at least one of the upper and lower chambers.

6. The apparatus of claim 5, wherein a shaft of each of the ball and screw mechanisms is rotated by the motor to cause at least one of the upper and lower chambers to move upward and downward.

7. The apparatus of claim 6, wherein the shafts of the ball and screw mechanisms are coupled to threaded portions of the lower chamber, and wherein rotation of the shafts causes the lower chamber to move upward and downward relative to the upper chamber.

8. The apparatus of claim 1, further comprising a plurality of linear movement guides that guide movement of at least one of the upper and lower chambers.

9. The apparatus of claim 8, wherein the linear movement guides are positioned on sides of the apparatus.

10. The apparatus of claim 9, wherein one linear movement guide is located at approximately a center of each side of the apparatus.

11. The apparatus of claim 9, wherein two linear movement guides are located on each side of the apparatus.

12. The apparatus of claim 11, wherein the linear movement guides on each side of the apparatus are located between a center and ends of the sides of the apparatus.

13. The apparatus of claim 9, wherein the linear movement guides are configured to prevent the sides of the upper and lower chambers from flexing inward when a pressure differential exists between the sealed space and an exterior of the apparatus.

14. The apparatus of claim 9, wherein the transportation mechanism moves the lower chamber up and down relative to the upper chamber.

15. The apparatus of claim 9, wherein the moving elements comprise four linear movement devices, and wherein one linear movement device extends outward from each of four corners of the at least one of the lower and upper chambers.

16. The apparatus of claim 9, wherein the chamber transportation mechanism comprises a motor that provides a driving force, and wherein the driving force of the motor is supplied to the moving elements.

17. The apparatus of claim 16, wherein the moving elements comprise bail and screw mechanisms that are coupled to at least one of the upper and lower chambers.

18. The apparatus of claim 17, wherein a shaft of each of the ball and screw mechanisms is rotated by the motor to cause at least one of the upper and lower chambers to move upward and downward.

19. The apparatus of claim 18, wherein the shafts of the ball and screw mechanisms are coupled to threaded portions of the lower chamber, and wherein rotation of the shafts causes the lower chamber to move upward and downward relative to the upper chamber.

20. The apparatus of claim 1, further comprising:
an alignment device that adjusts a position of at least one of the first and second substrates relative to the other to properly align the first and second substrates; and
a sealing member that is positioned between the upper and lower chambers when they are brought together to form the sealed space.

* * * * *